United States Patent [19]
Lee

[11] Patent Number: 5,920,784
[45] Date of Patent: Jul. 6, 1999

[54] METHOD FOR MANUFACTURING A BURIED TRANSISTOR

[75] Inventor: Woon-kyung Lee, Seoul, Rep. of Korea

[73] Assignee: Samsung Electronics Co., Ltd., Kyungki-Do, Rep. of Korea

[21] Appl. No.: 08/933,839

[22] Filed: Sep. 19, 1997

Related U.S. Application Data

[63] Continuation of application No. 08/482,986, Jun. 7, 1995, abandoned.

[30] Foreign Application Priority Data

Jun. 8, 1994 [KR] Rep. of Korea .................... 94-12852

[51] Int. Cl.$^6$ ................................................. H01L 21/336
[52] U.S. Cl. .................... 438/307; 438/200; 438/230; 438/297; 438/589; 438/241
[58] Field of Search ............................ 438/306, 305, 438/301, 297, 589, 270, 307, 272, 439, 443, 200, 230, 241; 437/34, 40 RG, 40 GS, 41 GS, 47, 48, 50, 52, 56, 57, 58, 44, 45, 203

[56] References Cited

U.S. PATENT DOCUMENTS

| | | | |
|---|---|---|---|
| 4,013,489 | 3/1977 | Oldham | 438/280 |
| 5,091,324 | 2/1992 | Hsu et al. | 437/56 |
| 5,234,859 | 8/1993 | Mametani et al. | 438/250 |
| 5,328,859 | 7/1994 | Vo et al. | 437/31 |
| 5,332,682 | 7/1994 | Lowrey | 437/47 |
| 5,342,796 | 8/1994 | Ahn et al. | 437/203 |
| 5,453,391 | 9/1995 | Yiu et al. | 437/52 |
| 5,453,395 | 9/1995 | Lur | 437/67 |
| 5,470,774 | 11/1995 | Kunitou | 437/47 |
| 5,480,823 | 1/1996 | Hsu | 437/203 |
| 5,536,670 | 7/1996 | Hsue | 437/52 |

FOREIGN PATENT DOCUMENTS 56-96865  8/1981  Japan .................... 437/40 RG

*Primary Examiner*—Michael Trinh
*Attorney, Agent, or Firm*—Pillsbury Madison & Sutro LLP

[57] ABSTRACT

A method for manufacturing a buried transistor, which includes the steps of forming a field oxide layer in a substrate, the field oxide region having a central portion having a greater thickness than opposite edge portions thereof, forming source/drain regions in the substrate, on opposite sides of the field oxide layer, removing the field oxide layer, and forming a gate electrode on the resultant structure.

7 Claims, 6 Drawing Sheets

5,920,784

METHOD FOR MANUFACTURING A BURIED TRANSISTOR

This is a continuation of application Ser. No. 08/482,986, filed on Jun. 7, 1995, which was abandoned upon the filing hereof.

BACKGROUND OF THE INVENTION

The present invention relates generally to a method for manufacturing transistors, and, more particularly, to a method for manufacturing a buried transistor in which the source/drain regions thereof are self-aligned with an insulating film formed on a channel region thereof.

A buried transistor is a transistor which is made by forming the source/drain regions thereof prior to forming the gate electrode thereof, in contrast to a conventional transistor, in which the gate electrode is formed first and then used as a mask for formation of the source/drain regions thereof. Among other applications, buried transistors are employed as the transistors constituting the cell array of read only memory devices (ROMs).

With reference now to FIGS. 1A–1G, a conventional method for manufacturing buried transistors of a semiconductor memory device (e.g., a ROM) will now be described.

With particular reference now to FIG. 1A, an N-well 12 and a P-well 14 are formed in a surface region of a semiconductor substrate 10 by using conventional CMOS twin well process technology. Next, a pad oxide film 16 is formed on the upper surface of the semiconductor substrate 10. Then, a silicon nitride ($Si_3N_4$) film 18 is deposited on the pad oxide film 16. Next, a photoresist layer is formed on the silicon nitride film 18, and then patterned, to thereby provide a patterned photoresist mask 20 having apertures over regions of the substrate 10 where field oxide regions are to be subsequently formed. Then, the portions of the pad oxide film 16 and silicon nitride film 18 underlying the apertures in the photoresist mask 20 are etched away, to thereby expose portions of the upper surface of the semiconductor substrate 10 corresponding to the regions where the field oxide regions are to be subsequently formed.

With particular reference now to FIG. 1B, the photoresist mask 20 is removed, and a patterned photoresist mask 22 is formed on the resultant structure. Next, boron ions are ion-implanted in the exposed surface regions of the semiconductor substrate 10, to thereby form channel stop regions 24 in the P-well 14.

With particular reference now to FIG. 1C, the photoresist mask 22 is removed, and the resultant structure is exposed to an oxide atmosphere, to thereby form field oxide regions 26 in the surface regions of both the N-well 12 and the P-well 14. Next, impurities are ion-implanted in the resultant structure to control the threshold voltage of the transistors to be subsequently formed in the N-well 12 and the P-well 14.

With particular reference now to FIG. 1D, a patterned photoresist mask 28 is formed on the resultant structure depicted in FIG. 1C, and source/drain regions 30 separated from one another by a distance "L" are formed in the cell region of the P-well 14, by ion-implanting N-type impurities into the surface region of the P-well 14, using the photoresist mask 28 as an ion-implantation mask.

With particular reference now to FIG. 1E, the photoresist mask 28 is removed, and a patterned photoresist mask 32 is formed on the resultant structure. The photoresist mask 32 exposes only the cell region of the resultant structure. Next, impurities are ion-implanted in the cell region of the P-well 14 to control the threshold voltage of transistors to be formed in the cell region of the P-well 14, using the photoresist mask 32 as an ion-implantation mask.

With particular reference now to FIG. 1F, the photoresist mask 32 is removed, and a gate insulation film 34 and a gate electrode layer are sequentially formed on the resultant structure. Next, a patterned photoresist mask 38 is formed on the resultant structure. Then, the gate electrode layer is etched, using the photoresist mask 38 as an etching mask, to thereby form gate electrodes 36. At this stage of the process, the NMOS memory cell transistors formed in the cell region of the P-well 14 are completed.

With particular reference now to FIG. 1G, the photoresist mask 38 is removed, and sidewall spacers 40 are formed on the sidewalls of the gate electrodes 36 in the PMOS and NMOS regions of the device. Next, lightly doped source/drain (LDD) regions 42 are formed in the N-well 12 and the P-well 14 on opposite sides of the gate electrodes 36 in the PMOS and NMOS regions of the device, to thereby provide a PMOS transistor in the N-well 12 and an NMOS transistor in the P-well 14.

As can be appreciated on the basis of the foregoing description, the source/drain regions of a buried transistor manufactured in accordance with the conventional technology are formed prior to formation of the gate electrode thereof. Consequently, the length "L" of the channel region of the buried transistors formed in the cell region of the semiconductor memory device is determined by the geometries of the photoresist mask 28, and the width of the channel region of the buried transistors formed in the cell region of the device is determined by the width of the gate electrode 36.

With additional reference now to FIG. 2, which is an enlarged view of a portion of the device enclosed by a dotted circle II in FIG. 1G, the reference numeral 3 designates the portion of the source/drain regions 30 which is present before the gate insulation film 34 is formed, the reference numeral 6 designates extended portions (OED regions) of the source/drain regions 30 which are formed after the gate insulation film 34 is formed, reference numeral 4 designates relatively thin portions of the gate insulation film 34 formed on channel regions of the buried transistors formed in the P-well 14, reference numeral 5 designates relatively thick portions of the gate insulation film 34 formed on the source/drain regions 30 of the buried transistors formed in the P-well 14, reference numeral 8 designates the encircled channel stop layer 24, reference numeral 7 designates the encircled field oxide region 26, and the reference numeral 9 designates the encircled portion of the gate electrode 36 formed on the cell region of the P-well 14. It can be seen that the effective channel length 1 of the buried transistors formed in the P-well 14 is shortened (and the effective length 2 of the source/drain regions 30 lengthened) due to the formation of the extended portions 6 of the source/drain regions 30 as a consequence of the formation of the gate insulation film 34, which lowers the punch-through voltage of the buried transistors formed in the cell region of the P-well 14.

In general, the punch-through characteristics of the buried transistors manufactured in accordance with the conventional method are degraded for the following three principal reasons.

First, the process steps for forming the gate insulation film 34 and the gate electrodes 36, and subsequent process steps for forming a high temperature oxide (HTO) layer (not shown) and a re-flowed BPSG layer (not shown), which are performed after the source/drain regions 30 are formed, thermally diffuse the source/drain regions 30 in a lateral direction, thereby reducing the effective channel length of the buried transistors, and thus, the punch-through voltage thereof.

Second, due to damage to the crystal structure of the source/drain regions 30 as a result of the ion-implantation process, the portions of the gate insulation film 34 on the source/drain regions 30 have a greater thickness than the portions of the gate insulation film 34 on the channel regions therebetween. In this connection, impurities (e.g., arsenic or phosphorus ions) constituting the source/drain regions 30 combine more easily with silicon than with oxide. Consequently, the oxidation enhanced diffusion (OED) regions 6 are formed at the boundaries between the channel region and the source/drain regions of the buried transistors when the gate insulation film 34 is formed, thereby significantly extending the effective length of the source/drain regions 30 of the buried transistors, and, conversely, significantly reducing the effective channel length of the buried transistors.

Third, due to resolution limitations of the photolithographic equipment employed in manufacturing high integration density devices having half-micron (or less) geometries (i.e., $\leq 0.5$ μm design rule), the channel length "L" of the buried transistors tends to be shorter and less uniform than desired, thereby further degrading the performance and punch-through voltage characteristics of the buried transistors manufactured in accordance with the conventional technology.

Based on the above, it can be appreciated that there presently exists a need in the art for a method for manufacturing a buried transistor which overcomes the above-described drawbacks and shortcomings of the conventional technology. The present invention fulfills this need.

SUMMARY OF THE INVENTION

The present invention encompasses a method for manufacturing a buried transistor, which includes the steps of forming a field oxide layer in a substrate, the field oxide region having a central portion having a greater thickness than opposite edge portions thereof, forming source/drain regions in the substrate, on opposite sides of the field oxide layer, removing the field oxide layer, and forming a gate electrode on the resultant structure.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

With reference now to FIGS. 3A–3F, a method for manufacturing a buried transistor in accordance with a preferred embodiment of the present invention will now be described, in the context of the manufacture of a semiconductor memory device (e.g., a ROM) having buried transistors. The device includes an NMOS region, a PMOS region, and a cell region.

Figure 3A:
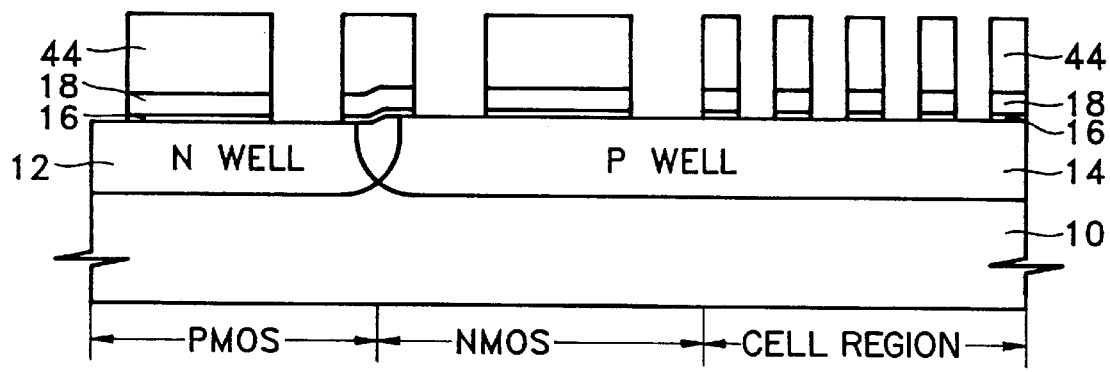
FIGS. 3A–3F are cross-sectional views depicting successive steps of a method for manufacturing a buried transistor in accordance with a preferred embodiment of the present invention.

With particular reference now to FIG. 3A, an N-well 12 and a P-well 14 are formed in a semiconductor substrate 10, in a conventional manner, e.g., by doping N-type impurities such as arsenic and phosphorus (i.e., pentavalent ions) in the substrate 10 for the N-well 12, and by doping P-type impurities such as boron (i.e., trivalent ions) for the P-well 14. Next, a pad oxide film 16 is formed on the upper surface of the substrate 10, and a silicon nitride ($Si_3N_4$) film 18 is formed on the pad oxide film 16. Then, a patterned photoresist mask 44 is formed on the silicon nitride film 18, and then, exposed portions of the silicon nitride film 18 and corresponding, underlying portions of the pad oxide film 16 are etched away, using the photoresist mask 44 as an etching mask.

Figure 1A:
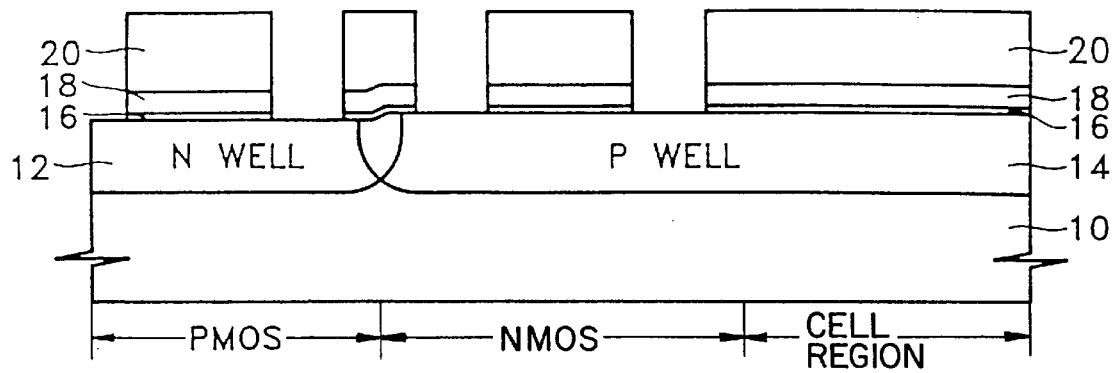
FIGS. 1A–1G are cross-sectional views depicting successive steps of a conventional method for manufacturing buried transistors.
Figure 1B:
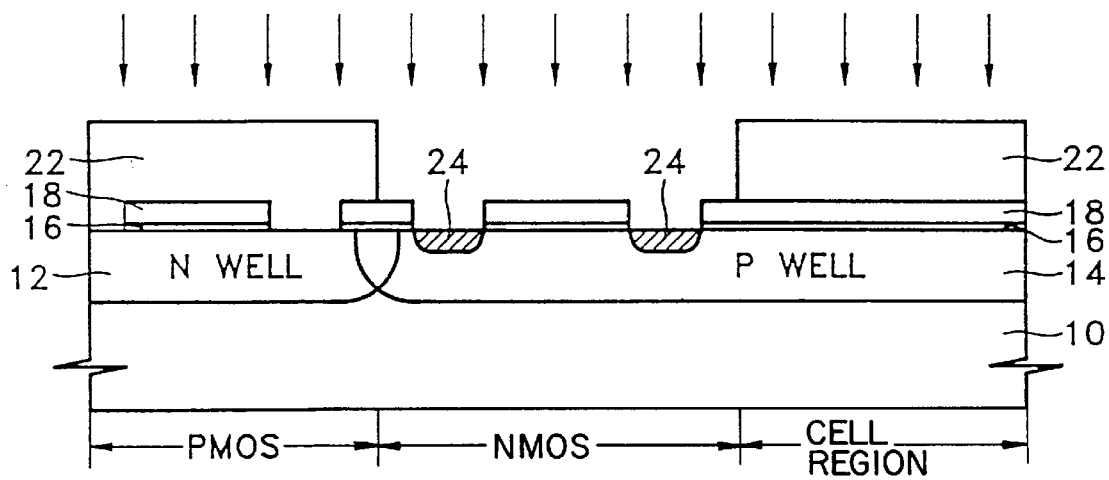

With reference now to both FIGS. 1A and 3A, it can be seen that the method of the present invention differs from the conventional method in that, with the method of the present invention, the photolithographic etching process exposes the surface portions of the cell region of the P-well 14 corresponding to channel regions of buried transistors to be subsequently formed in the cell region of the P-well 14, in addition to the surface portions of the N-well 12 and P-well 14 where field oxide regions (i.e., device separation regions) are to be subsequently formed.

Figure 3B:
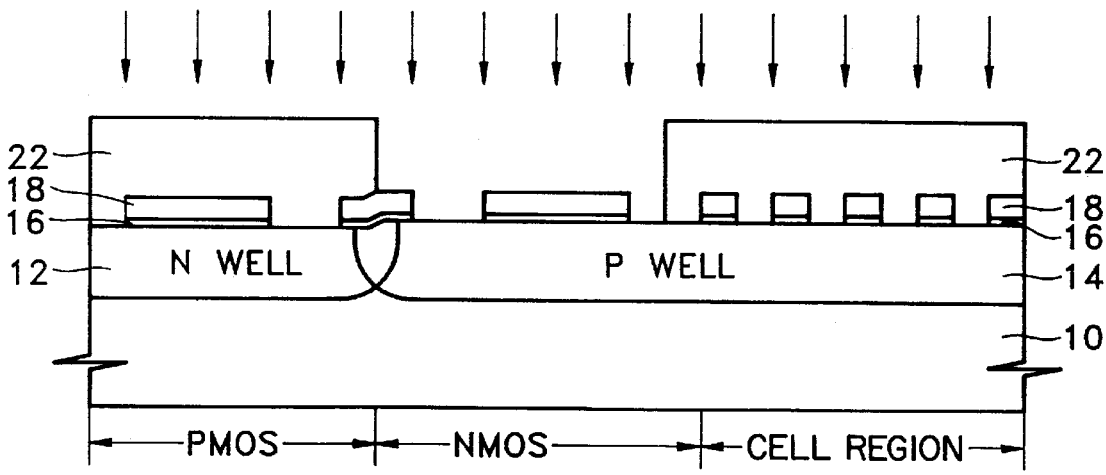

With particular reference now to FIG. 3B, the photomask 44 is removed, and a patterned photoresist mask 22 is then formed on the resultant structure. Next, P-type impurities, such as boron or other trivalent ions, are ion-implanted in exposed portions of the NMOS region of the P-well 14, using the photomask 22 as an ion-implantation mask, to thereby form channel stop regions 24. The channel stop regions 24 serve to enhance the NMOS device isolation characteristics.

Figure 3C:
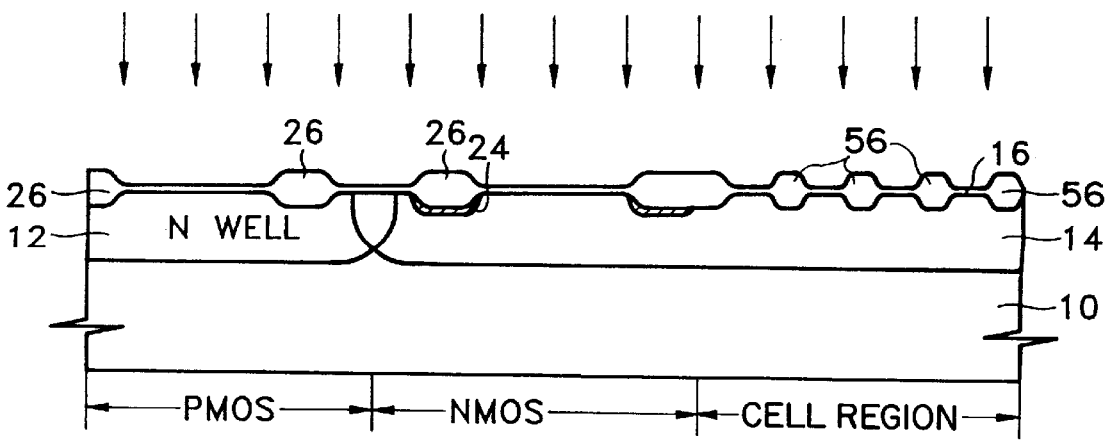

With particular reference now to FIG. 3C, the photomask 22 is removed, and then the entire surface of the resultant structure is exposed to an oxide atmosphere, to thereby form field oxide regions 26 in the exposed surface portions of the N-well 12 and P-well 14 and mask oxide regions 56 in the cell region of the P-well 14. The field oxide regions 26 and mask oxide regions 56 are preferably formed by a chemical vapor deposition (CVD) process, so that the central portion thereof is formed thicker than the edge portions thereof. Alternatively, the field oxide regions 26 and mask oxide regions 56 can be thermally grown, e.g., by employing a local oxidation of silicon (LOCOS) process.

Figure 1C:
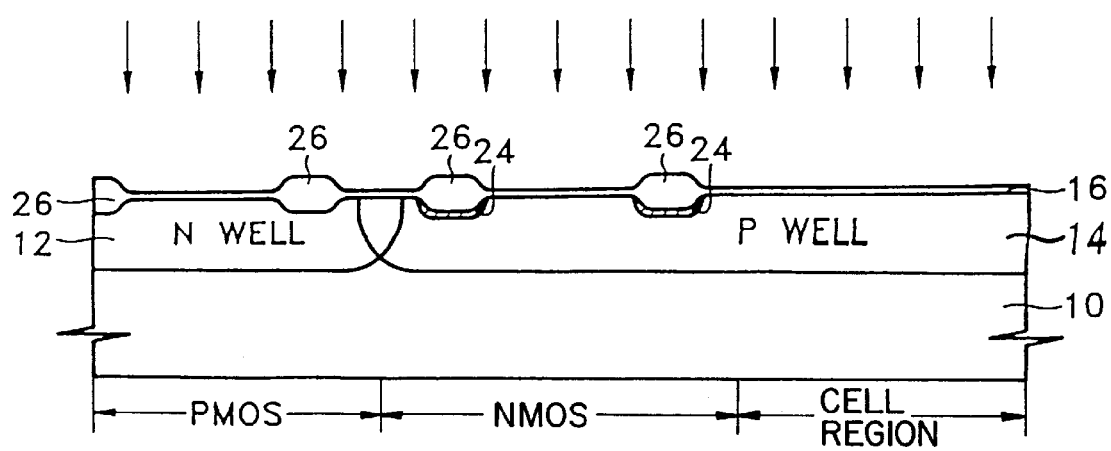
Figure 1D:
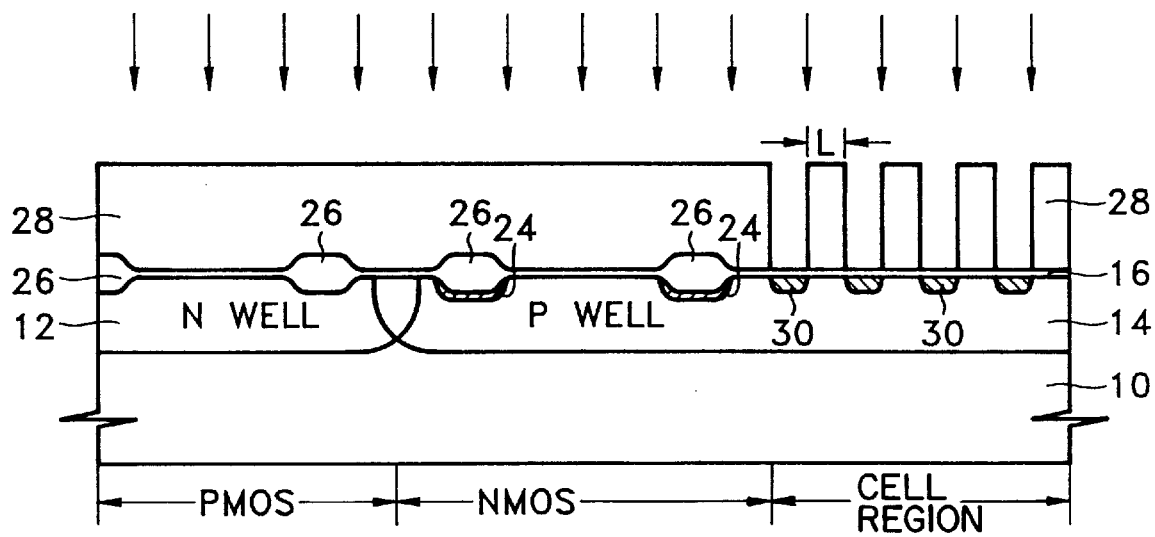
Figure 1E:
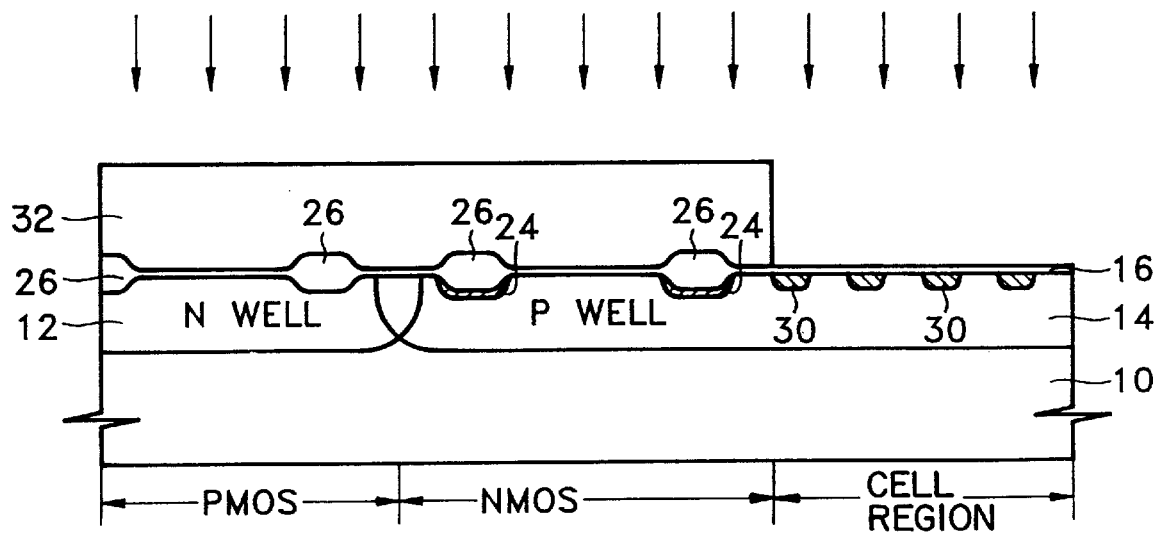

With additional reference to FIG. 1C, it can be seen that the method of the present invention differs from the conventional method, in that with the method of the present invention, mask oxide regions 56 are formed in the channel regions of the cell region of the P-well 14, in addition to the field oxide regions 26 formed in the device separation regions of the NMOS region of the P-well 14 and the PMOS region of the N-well 12. Next, impurities of the appropriate conductivity type are preferably ion-implanted in the exposed surface regions of both the N-well 12 and the P-well 14 to controllably adjust the threshold voltage of the buried transistors to be formed therein.

Figure 3D:
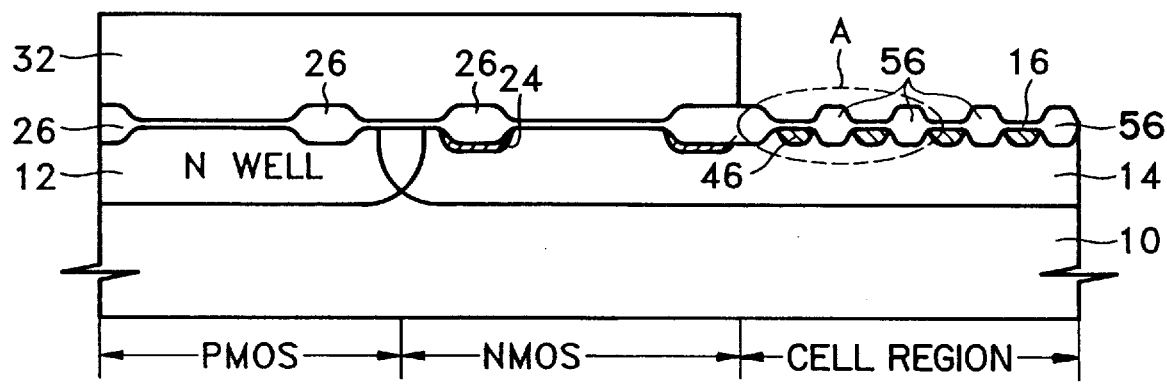

With particular reference now to FIG. 3D, a patterned photoresist mask 32 is formed on the resultant structure depicted in FIG. 3C, to cover the PMOS and NMOS regions of the structure, and to expose the cell region of the structure. Next, source/drain regions 46 are formed on opposite sides of the mask oxide regions 56 in the cell region of the P-well 14, e.g., by ion-implanting N-type impurities, such as arsenic, phosphorus, or other pentavalent ions. Preferably, the source/drain regions 46 are double-diffused regions, whereby two different types of impurities of the same conductivity type (in the present instance, N-type) having different diffusion coefficients, e.g., arsenic and phosphorus ions, are simultaneously, or sequentially, ion-implanted, at preferably different concentrations.

In accordance with a preferred embodiment of the present invention, a first type of impurity, e.g., arsenic, is ion-implanted at a first concentration. Then, the thickness and width of the field oxide regions 26 and mask oxide regions 56 are controllably adjusted, as required, e.g., by employing a wet etching process. Next, a second type of impurity, e.g., phosphorus, is ion-implanted at a second concentration. It is desirable that the first concentration be greater than the second concentration.

As can now be readily appreciated, the source/drain regions 46 are self-aligned with the mask oxide regions 56 in the cell region of the device, and the dimensions of the source/drain regions 46 are determined by the dimensions (i.e., thickness and width) of the mask oxide regions 56. Accordingly, the dimensions (e.g., length) of the channel regions of the buried transistors to be formed in the cell region of the P-well 14 can be easily and precisely controlled by controlling the thickness and width of the mask oxide regions 56.

After the source/drain regions 46 are formed, an appropriate type and concentration of impurities, e.g., boron ions, are preferably ion-implanted into the exposed portions of the surface region of the P-well 14, in order to controllably adjust the threshold voltage of the buried transistors to be formed in the cell region of the P-well 14. Alternatively, this step can be performed after the mask oxide regions 56 are removed in the step described below.

Figure 3E:
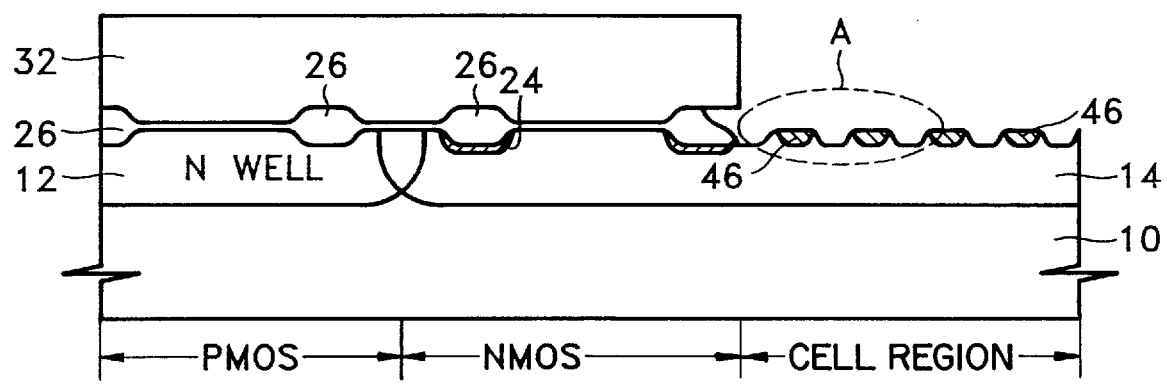

With particular reference now to FIG. 3E, the mask oxide regions 56 in the cell region of the device are removed, e.g., by employing a wet etching process, thereby exposing the channel regions of the buried transistors to be formed in the cell region of the P-well 14.

Figure 1F:
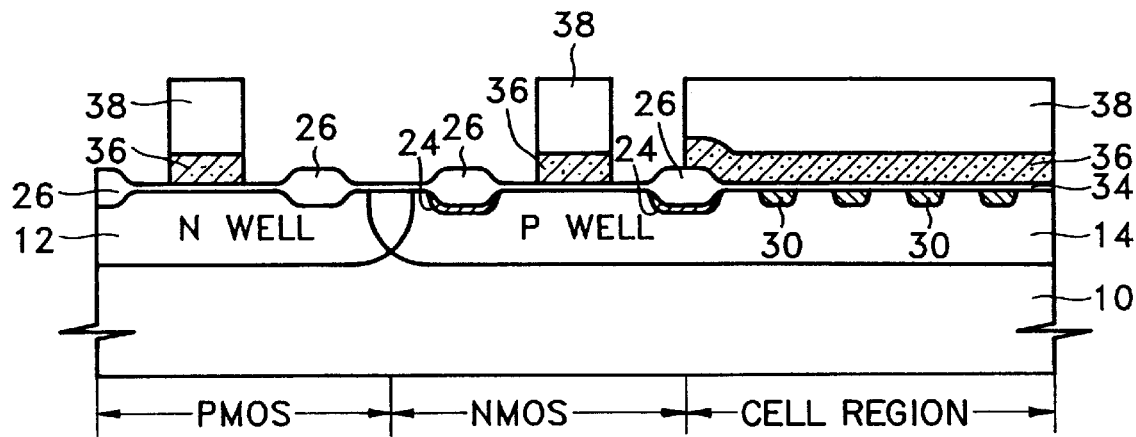
Figure 1G:
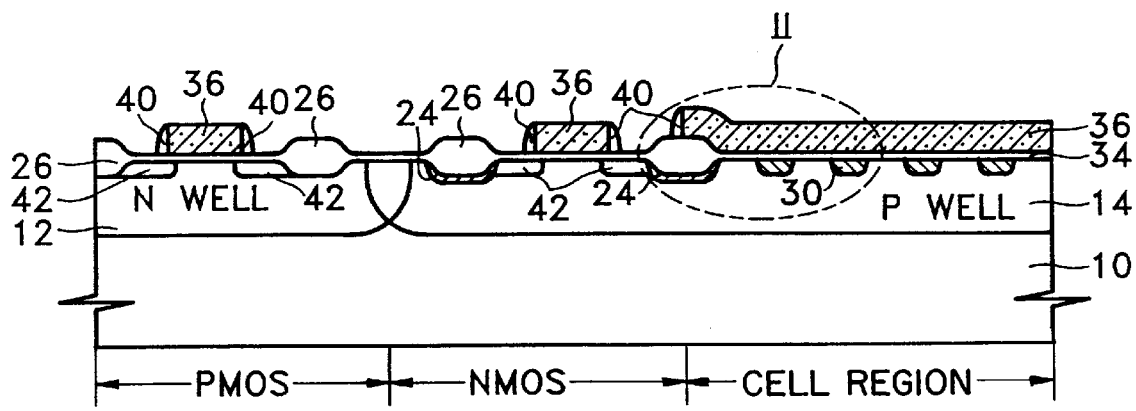
Figure 2:
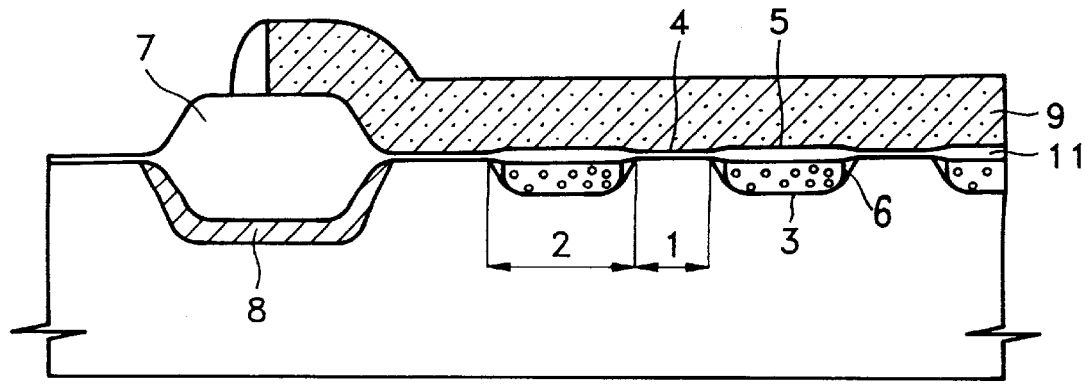
FIG. 2 is an enlarged view of a portion (designated II) of the device depicted in FIG. 1G.
Figure 3F:
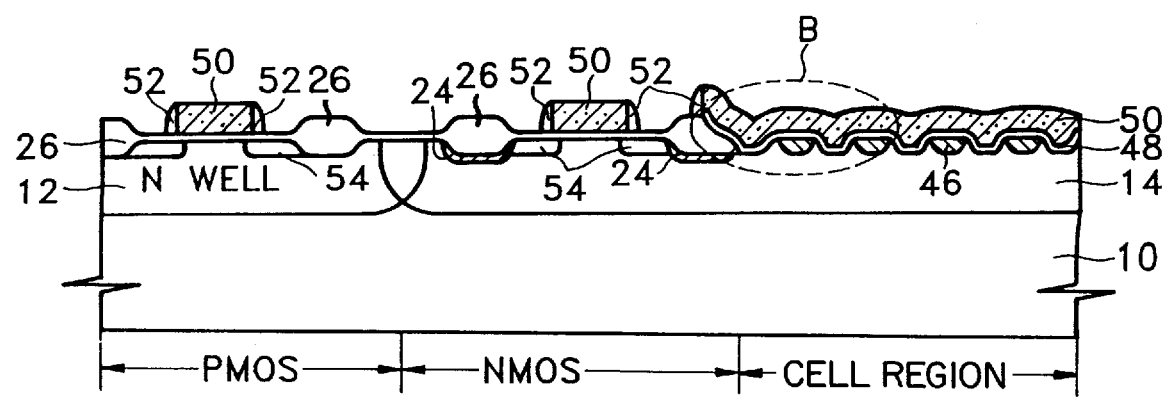

With particular reference now to FIG. 3F, the photomask 32 is removed, and a gate insulation film 48 and a gate electrode layer are sequentially formed on the resultant structure. Next, a patterned photoresist mask (not shown—but like the photomask 38 depicted in FIG. 1F) is formed on the resultant structure. Then, the gate electrode layer is etched, using the photoresist mask as an etching mask, to thereby form gate electrodes 50. At this stage of the process, the buried NMOS memory cell transistors formed in the cell region of the P-well 14 are completed.

Next, the photoresist mask is removed, and low concentration impurities of the appropriate conductivity type (e.g., P-type impurities for the N-well 12 and N-type impurities for the P-well 14) are ion-implanted in the PMOS and NMOS regions of the N-well 12 and P-well 14, on opposite sides of the gate electrodes 50. Then, sidewall spacers 52 are formed on the sidewalls of the gate electrodes 50 in the PMOS and NMOS regions of the N-well 12 and P-well 14. Next, a high concentration of impurities of the appropriate conductivity type are ion-implanted in the PMOS and NMOS regions of the N-well 12 and P-well 14, on opposite sides of the gate electrodes 50, to thereby provide lightly doped drain (LDD)-structure source/drain regions 54, and thereby complete the buried PMOS transistor in the N-well 12 and the buried NMOS transistor in the NMOS region of the P-well 14.

Figure 4A:
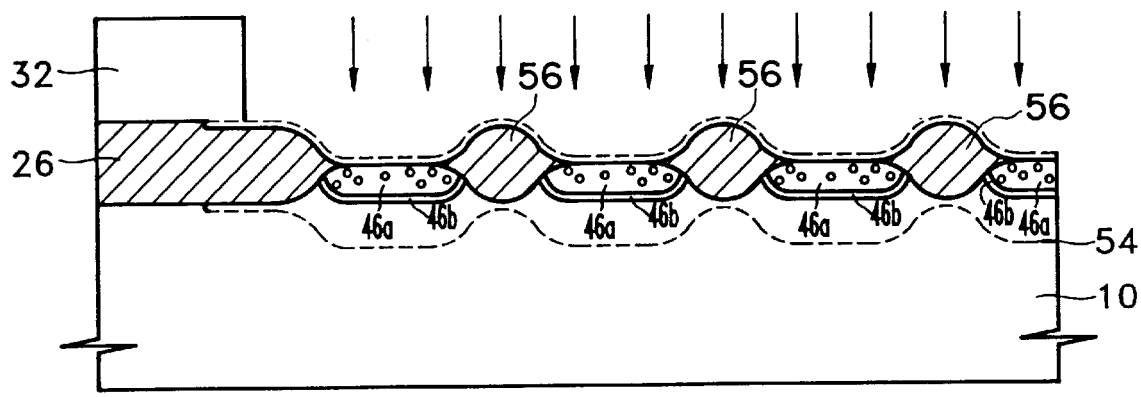
FIG. 4A is an enlarged view of a portion (designated A) of the device depicted in FIG. 3D.
Figure 4B:
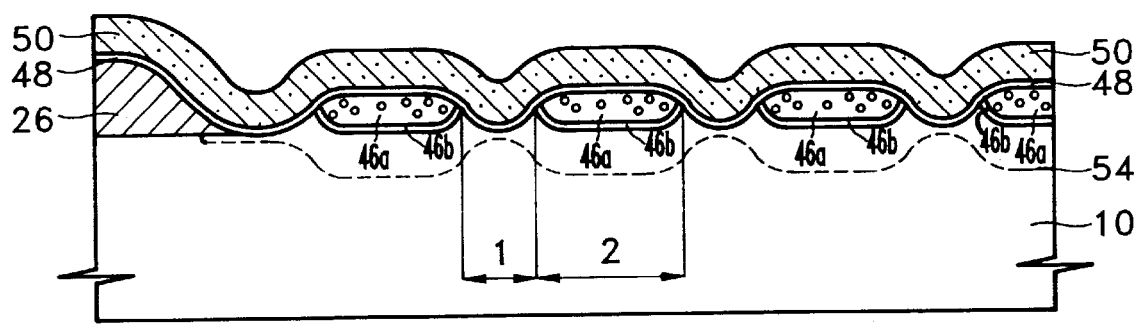
FIG. 4B is an enlarged view of a portion (designated B) of the device depicted in FIG. 3F; and, FIG. 5 is a cross-sectional view depicting an alternative step of the method for manufacturing a buried transistor in accordance with the preferred embodiment of the present invention.

With additional reference now to FIGS. 4A and 4B, which are enlarged views of the portions of the device designated "A" in FIG. 3D and "B" in FIG. 3F, respectively, the reference numeral 46a represents the first diffused portion of the double-diffused source/drain regions 46, and the reference numeral 46b represents the second diffused portion of the double-diffused source/drain regions 46. The first diffused portion 46a is formed by the first ion-implantation step which is performed in forming the double-diffused source/drain regions 46, and the second diffused portion 46b is formed by the second ion-implantation step which is performed in forming the double-diffused source/drain regions 46. The reference numeral 1 represents the effective length of the channel regions of the buried transistors formed in the cell region of the P-well 14, and the reference numeral 2 represents the effective length of the double-diffused source/drain regions 46 of the buried transistors formed in the cell region of the P-well 14.

The upper dotted line in FIG. 4A represents the height of the mask oxide regions 56 when the first diffusion portion 46a of the double-diffused source/drain regions 46 is formed, and the solid line therebeneath represents the height of the mask oxide regions 56 when the second diffusion portion 46b of the double-diffused source/drain regions 46 is formed. The lower dotted line 54 illustrates the majority carrier concentration profile.

As can be seen in FIG. 4B, the double-diffused source/drain regions 46 of the buried transistors do not have extended portions (OED regions) which reduce the effective channel length of the channel regions and increase the effective channel length of the source/drain regions, such as do the buried transistors made by the conventional method discussed hereinbefore. Additionally, the concentration of majority carriers is closer to the surface in the channel regions of the buried transistors made by the method of the present invention, and, consequently, the impurity concentration of the source/drain depletion regions is increased, thereby increasing the punch-through voltage of the buried transistors.

Figure 5:
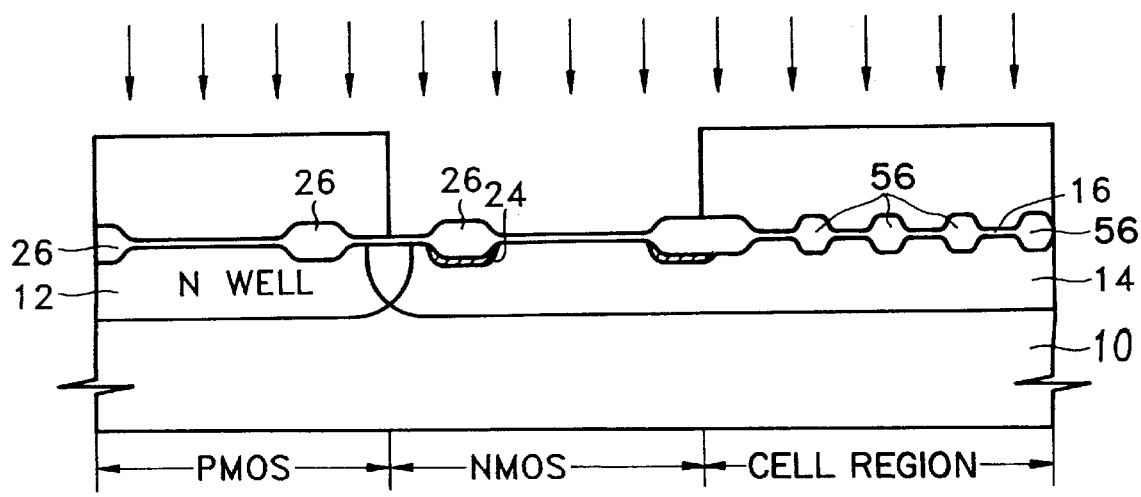

With particular reference now to FIG. 5, an alternative embodiment of the method of the present invention will now be described. The alternative embodiment differs from the above-described preferred embodiment only with respect to the sequence of the formation of the channel stop regions 24 and field oxide regions 26. More particularly, in the alternative embodiment, the channel stop regions 24 are formed after the field oxide regions 26 are formed, whereas, in the preferred embodiment, the channel stop regions 24 are formed before the field oxide regions 26 are formed.

Although preferred and alternative embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for manufacturing a buried transistor, comprising the steps:

forming an oxide layer in a substrate, said oxide layer including at least one mask oxide region having a central portion disposed between opposite edge portions, said central portion having a thickness and a width, said thickness of said central portion being greater than a thickness of said opposite edge portions;

controllably reducing said thicknesses of said central portion and opposite edge portions and said width of said central portion of said mask oxide region to thereby control a desired effective channel length of said buried transistor;

forming first diffusion portions of source and drain regions by, before said controllably reducing step is performed, doping first impurities, at a first concentration, in said substrate where said opposite edge portions of said mask oxide region are formed;

forming second diffusion portions of said source and drain regions by, after said controllably reducing step is performed, doping second impurities, at a second concentration, in said substrate where said opposite edge portions of said mask oxide region are formed, wherein said first and second impurities are of the same conductivity type;

removing said oxide layer;

forming a gate insulation film over a resultant structure obtained by the step of removing said oxide layer; and forming a gate electrode over said gate insulation film.

2. The method as set forth in claim 1, wherein the step of forming said oxide layer is implemented by using a LOCOS process.

3. The method as set forth in claim 1, wherein the step of forming said oxide layer is implemented by using a CVD process.

4. The method as set forth in claim 1, wherein said first concentration is higher than said second concentration.

5. The method as set forth in claim 4, wherein said first impurities are phosphorus ions and said second impurities are arsenic ions.

6. The method as set forth in claim 4, wherein the doping of said first and second impurities in said substrate is performed by an ion-implantation process.

7. The method as set forth in claim 1, wherein the step of controllably reducing said thicknesses and said width is carried out by using a wet etching process.

* * * * *